United States Patent [19]

McKinley

[11] Patent Number: 5,781,784
[45] Date of Patent: Jul. 14, 1998

[54] DYNAMIC POWER MANAGEMENT OF SOLID STATE MEMORIES

[75] Inventor: David E. McKinley, San Jose, Calif.

[73] Assignee: Zilog, Inc., Campbell, Calif.

[21] Appl. No.: 918,745

[22] Filed: Aug. 25, 1997

Related U.S. Application Data

[63] Continuation of Ser. No. 368,577, Jan. 4, 1995, abandoned, which is a continuation of Ser. No. 910,213, Jul. 9, 1992, abandoned.

[51] Int. Cl.[6] ............................................. G06F 1/32
[52] U.S. Cl. ..................... 395/750.03; 395/750.01; 364/707; 365/227; 365/228; 365/229
[58] Field of Search ................ 395/750.03, 750.01; 364/707; 365/227, 228, 229

[56] References Cited

U.S. PATENT DOCUMENTS

| | | | |
|---|---|---|---|
| 4,365,290 | 12/1982 | Nelms et al. | 395/750 |
| 4,467,421 | 8/1984 | White | 395/425 |
| 4,630,230 | 12/1986 | Sundet | 395/425 |
| 4,672,586 | 6/1987 | Shimohigashi et al. | 365/229 |
| 4,683,382 | 7/1987 | Sakurai et al. | 365/226 |
| 4,777,626 | 10/1988 | Matsushita et al. | 365/226 |
| 4,812,677 | 3/1989 | Perry | 371/66 |
| 4,881,205 | 11/1989 | Aihara | 364/707 |
| 4,901,283 | 2/1990 | Hanbury et al. | 395/750 |
| 4,933,902 | 6/1990 | Yamada et al. | 365/226 |
| 4,943,960 | 7/1990 | Komatsu et al. | 365/189.09 |
| 4,964,073 | 10/1990 | Watanabe | 364/707 |
| 4,977,537 | 12/1990 | Dias et al. | 365/229 |
| 5,021,679 | 6/1991 | Fairbank et al. | 364/707 |
| 5,033,027 | 7/1991 | Amin | 365/22 |
| 5,034,915 | 7/1991 | Styrna et al. | 371/66 |
| 5,041,964 | 8/1991 | Cole et al. | 364/707 |
| 5,063,304 | 11/1991 | Iyenger | 365/189.09 |
| 5,070,477 | 12/1991 | Tuma et al. | 395/500 |
| 5,077,737 | 12/1991 | Leger et al. | 371/13 |
| 5,148,546 | 9/1992 | Blodgett | 395/750 |
| 5,167,024 | 11/1992 | Smith et al. | 364/375 |
| 5,193,198 | 3/1993 | Yokouchi | 365/226 |
| 5,218,607 | 6/1993 | Saito et al. | 371/66 |
| 5,218,705 | 6/1993 | DeLuca et al. | 395/750 |
| 5,237,699 | 8/1993 | Little et al. | 395/750 |
| 5,239,495 | 8/1993 | Nanno et al. | 364/707 |
| 5,241,680 | 8/1993 | Cole et al. | 395/750 |
| 5,255,224 | 10/1993 | Galbi et al. | 365/226 |
| 5,283,792 | 2/1994 | Davies, Jr. et al. | 395/575 |
| 5,297,098 | 3/1994 | Nakatani et al. | 365/226 |
| 5,299,154 | 3/1994 | Oowaki et al. | 365/149 |
| 5,301,160 | 4/1994 | McAdams | 365/226 |
| 5,307,315 | 4/1994 | Oowaki et al. | 365/189.09 |
| 5,396,635 | 3/1995 | Fung | 395/750 |
| 5,404,543 | 4/1995 | Faucher et al. | 395/750 |
| 5,414,861 | 5/1995 | Horning | 395/750 |
| 5,499,209 | 3/1996 | Oowaki et al. | 365/189.01 |

*Primary Examiner*—George B. Davis
*Attorney, Agent, or Firm*—Skjerven, Morrill, MacPherson Franklin & Friel LLP; Alan H. MacPherson; Fabio E. Marino

[57] ABSTRACT

A dynamic power management device for supplying power to a solid state memory integrated circuit includes power control circuitry for supplying a variable voltage to the memory integrated circuit and logic control circuitry responsive to data access activity for generating address and control signals for the memory integrated circuit and for controlling the power control circuitry to supply power to the memory integrated circuit sufficient to maintain memory information in the memory integrated circuit during periods of no data access activity and sufficient to exchange memory information with the memory integrated circuit during periods of data access activity. Power consumption of the memory integrated circuit is thereby curtailed.

23 Claims, 7 Drawing Sheets

DYNAMIC POWER MANAGEMENT OF SOLID STATE MEMORIES

This application is a continuation of application Ser. No. 08/368,577, filed Jan. 4, 1995, now abandoned which is a continuation of application Ser. No. 07/910,213 filed Jul. 9, 1992, now abandoned.

BACKGROUND OF THE INVENTION

1. Field of the Invention

The present invention relates to memory controllers for solid state memories and particularly to such a memory controller having a power management function allowing the power consumption of solid state memories to be curtailed.

2. State of the Art

One of the present trends in computing is toward increasing miniaturization. Laptop, notebook and palmtop computers represent the fastest growing market segment in the computer market. Particularly with regard to laptop and notebook computers, the demand for mass storage devices for such computers, coupled with the space constraints inherent in building these machines, has resulted in the form factor of disk drives being driven from 5¼ inch to 3½ inch and now down to 2½ inch. The projected trend is from 2½ inch form factor drives prevalent today toward sub-two-inch drives in 1994 and sub-one-inch drives in 1997.

As the form factor of disk drives becomes smaller, a multitude of serious problems may be expected to be encountered. Small disk plating techniques exhibit very low production yields. Since very low flying heads or even contact recording heads are required due to low linear disk speed and higher bit densities, contact of the head with the disk can cause "head slapping", resulting in higher shock requirements and excessive disk wear. Low-yield thin-film heads or vertical recording technology heads are required, as are small bearings or ceramics for the necessary motors and actuators. Signals-to-noise ratios will be significantly decreased, forcing the user to tolerate higher error rates and possible data loss. To accentuate the foregoing difficulties, hard disk suppliers are becoming fewer. As a result, the magnetic hard disk found in high-volume notebook PCs is expected to become difficult to purchase due to difficulty on the part of the hard disk manufacturer of supplying quality merchandise that can be produced with economical yields.

In contrast to the foregoing situation, solid state semiconductor memories, in particular DRAMs, are presently in abundant supply at relatively low cost. In this respect, DRAMs represent an attractive alternative to small form factor disk drives for mass memory storage. Unfortunately, however, DRAMs continually consume power, a scarce commodity in notebook applications. What is needed then is a way of curtailing the power consumption of DRAMs so that they may be used for mass memory storage in notebook applications. Using DRAMs, memory performance may be increased by a factor of several times over comparable hard drives.

SUMMARY OF THE INVENTION

According to the present invention, a dynamic power management device for supplying power to a solid state memory integrated circuit includes power control circuitry for supplying a variable voltage to the memory integrated circuit and logic control circuitry responsive to data access activity for generating address and control signals for the memory integrated circuit and for controlling the power control circuitry to supply power to the memory integrated circuit sufficient to maintain memory information in the memory integrated circuit during periods of no data access activity and sufficient to exchange memory information with the memory integrated circuit during periods of data access activity. Power consumption of the memory integrated circuit is thereby curtailed.

BRIEF DESCRIPTION OF THE DRAWINGS

The invention may be further understood from the following detailed description in conjunction with the appended drawings. In the drawings.

DETAILED DESCRIPTION OF THE PREFERRED EMBODIMENTS

The dynamic power management device implements a dynamic power management strategy having several different elements in order to achieve significant power savings. Dynamic power management is applied not only to solid state memories but also to the dynamic power management device itself. The basic element of the power conservation strategy is to essentially turn off all functions not required at any particular time. The dynamic power management device may be used in conjunction with non-volatile semiconductor memories, for example, in which case power to the memories may be substantially or completely turned off except during access. The dynamic power management device may be used to greatest advantage in conjunction with DRAMs, however, because of the requirement of DRAMs for a continuous supply of power. When used in conjunction with DRAMs, the dynamic power management device supplies power to the memory sufficient to maintain memory information during periods of no data access activity and sufficient to exchange memory information with the memory during periods of data access activity. Hence, during periods of no data access activity, a minimal voltage is supplied to memory. During periods of data access activity, a greater operational voltage is supplied to memory. During transitional periods from non-activity to activity, the voltage is ramped up and then ramped back down. For DRAMs, data access activity includes both memory refresh and memory access.

Furthermore, inputs to memory chips are "driven softly" to conserve power. For capacitive loads, the power consumed is proportional to the time rate of change of voltage, dV/dt. The time rate of change of voltage is also referred to as the slew rate. The dynamic power management device uses slew rate controllers, driver circuits designed to have voltage rise and fall times prolonged in comparison to those of usual driver circuits, in order to reduce the slew rate and hence power consumption. Furthermore, address inputs are encoded using gray code such that only one address input changes at a time. Finally, in order to minimize the power consumed by multiple chips, data is stored into and read out of the chips serially with tens or even hundreds of consecutive bytes being stored on a single chip, such that only one chip needs to be active at any given time, thus reducing power consumption.

Figure 1:
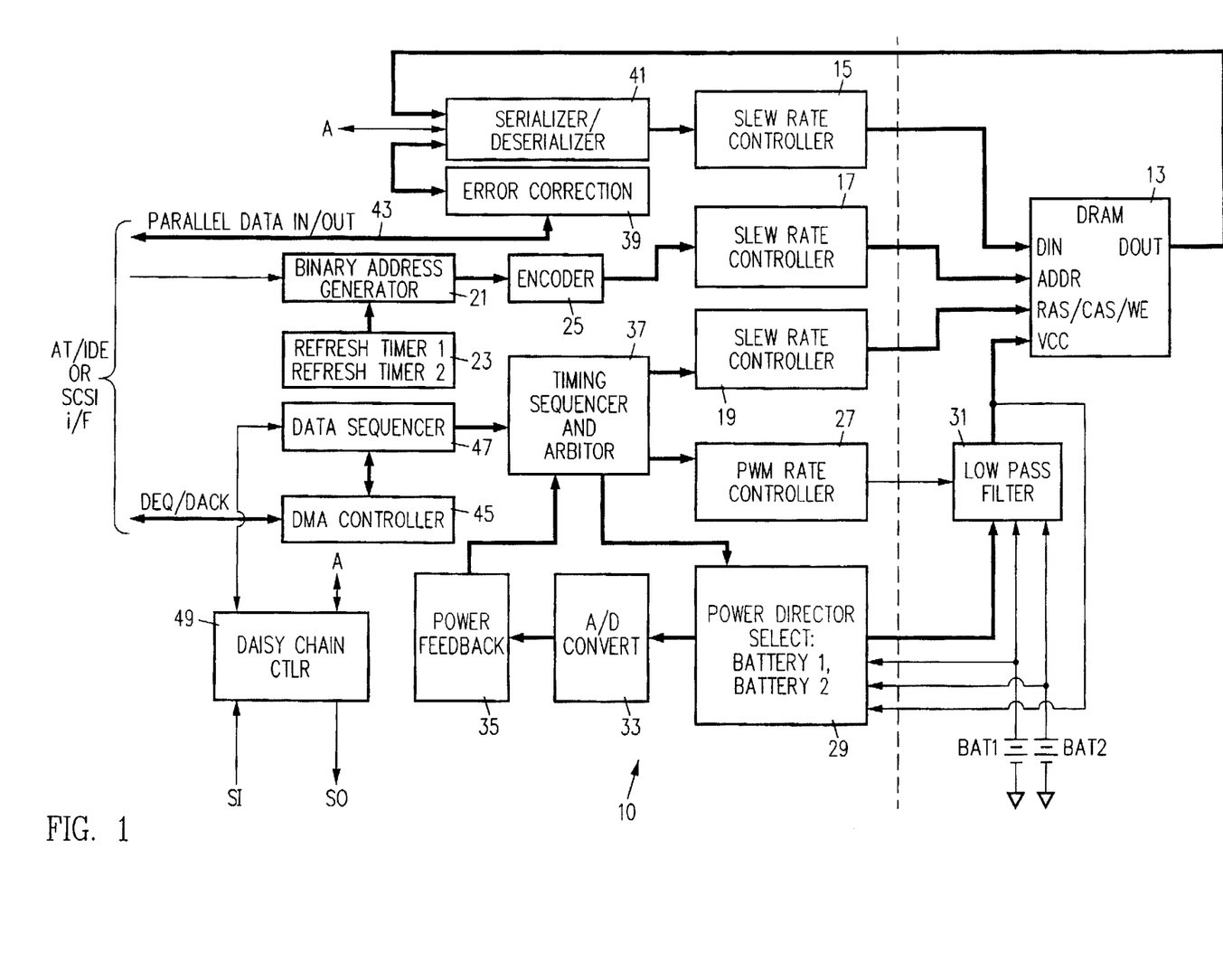
FIG. 1 is a block diagram of the dynamic power management device of the present invention.
Figure 2A:
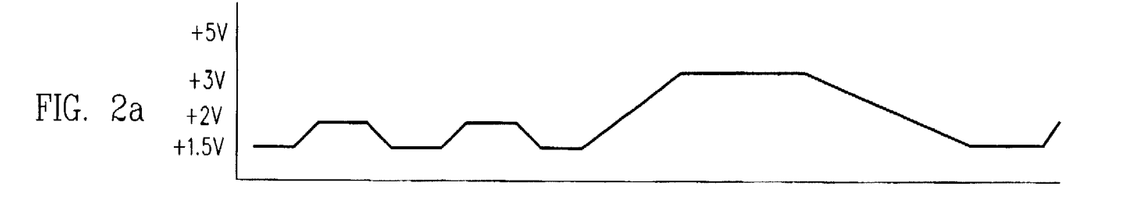
FIGS. 2a, 2b, 2c and 2d are waveform diagrams illustrating variable voltage control during DRAM operation.
Figure 2B:
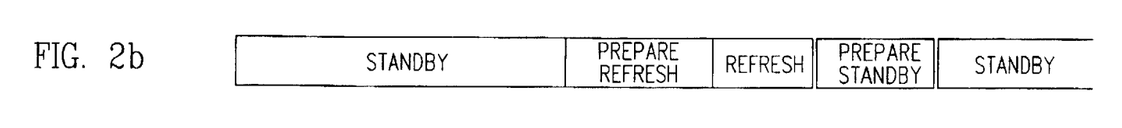
Figure 2C:
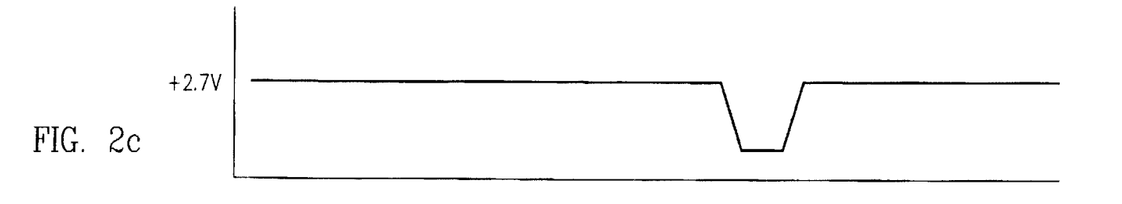
Figure 2D:
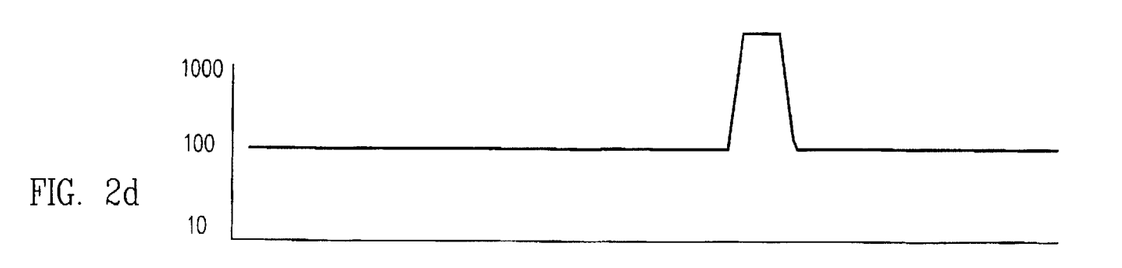

Referring now to FIG. 1, the dynamic power management device 10 may be interposed between a host device provided with an intelligent interface, such as an AT/IDE, ESDI or SCSI interface, and the solid state memory 13. Intelligent interfaces such as the IDE, ESDI and SCSI interfaces are typically attached between a host computer and a rotating memory device. The host merely requests blocks of data information in 512-byte increments. The data is then intelligently managed between the rotating memory device and the host system. An error recovery system causes operations resulting in errors to be retried. In this manner, the intelligent interface provides a data path from the mass storage device to the host system without apparent data failure. The power management device may be used in a solid state disk that in comparison to conventional hard disks offers greatly improved performance but looks to the computer exactly like a conventional hard disk.

As seen in FIG. 1, the dynamic power management device 10 provides all of the data, address and control inputs for the solid state memory 13. The dynamic power management device also provides an operating voltage VCC to the solid state memory 13. The voltage VCC is dynamically varied, or "cycled" according to different modes of operation of the solid state memory 13. The data output of the solid state memory 13 is received by the dynamic power management device 10. Preferably, the power management device 10 is realized predominantly as a single integrated circuit. In FIG. 1, blocks to the left of the dashed vertical line are preferably realized on a single chip.

The slew rates of all of the digital inputs to the solid state memory 13 are minimized using slew rate controllers 15, 17 and 19 to conserve power. As previously mentioned, the slew rate controllers may be input drivers designed to have prolonged rise times and fall times in comparison to conventional input drivers. Further power conservation is achieved by Gray coding address inputs to the solid state memory 13. A binary address generator 21 generates binary addresses in response to a request from the host or in response to a refresh timer block 23. The refresh timer block 23 implements two different refresh timers, one for regular refresh and one for extended refresh, to take advantage of the extended refresh capabilities of some solid state memories. Extended refresh is much slower, typically ten times slower, than conventional refresh and therefore consumes less power. Binary addresses generated by the address generator 21 are Gray coded by an encoder 25 before being input to the slew rate controller 17 and to the solid state memory 13.

Power to the solid state memory is controlled using pulse width modulation (PWM) by a PWM rate controller 27. Power is supplied by either a main battery BAT1 or a backup battery BAT2 selected between by a power director 29. Voltages from the main and backup batteries, a select signal from the power director 29 and a pulse width modulation signal from the PWM rate controller 27 are all input to an external low pass filter 31. In an exemplary embodiment, the low pass filter 31 may be a conventional RLC filter and may additionally include a selection circuit and a FET power driver. The selection circuit selects either the main battery, the backup battery, or possibly some other power source to supply power to the FET power driver. The pulse width modulation signal from the PWM rate controller 27 is filtered in the low pass filter and input to the FET power driver, which produces the voltage VCC. The voltage VCC is used to power the solid state memory 13 and is also input to the power director 29.

Closed-loop power monitoring is performed by the power director 29, an A/D converter 33 and a power feedback block 35 under the control of a timing sequencer and arbitor 37. The power director 29 receives voltages from each of the power sources in addition to the controlled voltage VCC. Preferably the power director 29 also produces an internal reference voltage for calibration purposes. The foregoing voltages are input to an analog multiplexer or other analog switch and are selected in turn by the timing sequencer and arbitor 37 to be sampled using the A/D converter 33. The digital representation of the selected voltage is input to the power feedback block 35, which compares the voltage value with a voltage value required by the solid state memory 13 in a particular mode of operation. The power feedback block 35 notifies the timing sequencer and arbitor 37 whether or not the selected voltage is sufficient for the desired operation. If not, the pulse width duty cycle may be increased or another source may be selected. Closed-loop monitoring ensures that an adequate voltage is applied to the solid state memory 13.

The timing sequencer and arbitor generates all the necessary control signals for the solid state memory 13 including RAS, CAS and WE signals. When power is insufficient, the control signals that initiate an operation are delayed until adequate power has been confirmed. The timing sequencer and arbitor 37 also arbitrates between memory access by the host and memory refresh.

Data is input to and output from the solid state memory 13 across a data path including an error correction block 39 and a serializer/deserializer 41. Error detection and correction is performed using a well-known polynomial cyclic redundancy code (CRC). Incoming data is therefore error correction coded, serialized in the serializer/deserializer 41 and input to the solid state memory 13 through the slew rate controller 17. Data output from the solid state memory 13 are deserialized in the serializer/deserializer 41 and input to the error correction block 39 for error detection and correction. Error-free data is then transferred to the host on a parallel data bus 43.

Data path control is provided by a DMA controller 45 in cooperation with a data sequencer 47 connected to the timing sequencer and arbitor 37. The DMA controller 45 performs data transfer handshaking with the host. The DMA controller 45 is also provided with byte count registers to keep track of the number of data bytes remaining to be transferred. The data sequencer 47 signals the DMA controller 45 when a data byte is ready to be transferred, whereupon the DMA controller 45 issues a DMA request (DRQ) to the host. Upon acknowledgement of the request from the host by means of a DMA acknowledge signal (DACK), the byte is transferred on the parallel data bus 43. When all bytes have been transferred, the DMA controller 45 raises a transfer done signal, signaling the host that the requested number of data bytes, for example 512, have been transferred. The data sequencer 47 controls all timing internal to the dynamic power management device 10. The data sequencer 47 therefore controls conversion of data between serial and parallel. The data sequencer also controls operation of the error correction block. 39 supervises direct memory access, and times out the memory control signals RAS, CAS and WE.

The dynamic power management device is also provided with a daisy chain controller 49 allowing multiple dynamic power management devices each associated with one or more solid state memories to be connected together to realize a single high-capacity solid-state memory. The daisy chain controller 49 is provided with a serial input SI and a serial output signal So for communication with a daisy chain controller in another dynamic power management device. When data is required to be read from or written to a solid state memory associated with a dynamic power management device (slave) other than the dynamic power management device in communication with the host (master), the data sequencer 47 causes a command to be daisy chained to the appropriate dynamic power management device. Data provided from another power management device is transferred in serial form from the daisy chain controller 49 to the serializer/deserializer 41 where it is converted to parallel form for transfer to the host. Data from the host to be provided to another dynamic power management device is serialized in the serializer/deserializer 41 and transferred to the daisy chain controller 49 to be passed down the chain to the appropriate dynamic power management device.

Operation of the dynamic power management device 10 to cycle power to the solid state memory 13 in accordance with different modes of operation of the solid state memory may be appreciated from FIGS. 2a–2d. During a standby period of operation shown in FIG. 2b, the operational voltage supplied to the solid state memory 13, shown in FIG. 2a, cycles between approximately 1.5 volts and 2 volts. During this period, the pulse width modulation signal is set to a minimum duty cycle sufficient to maintain data in the solid state memory 13. With each pulse, the voltage rises to approximately 2 volts; between pulses, the low pass filter 31 causes the voltage to be sustained at about 1.5 volts. In preparation for a refresh cycle during a Prepare Refresh period shown in FIG. 2b, the duty cycle of the pulse width modulation signal is increased, causing the voltage to ramp up from about 1.5 volts to about 3 volts. When the voltage has reached about 3 volts, sufficient to perform a refresh operation, the power feedback block 35 of FIG. 1 signals the timing sequence and arbiter 37 that it may proceed with a RAS cycle, initiating refresh. During a refresh period shown in FIG. 2b, the RAS signal generated by the timing sequencer and arbiter 37 drops low from a nominal value of about 2.7 volts. Current flow increases correspondingly from a quiescent current of about 100 microamps to about 1000 microamps. When refresh has been completed, the RAS signal is again raised, causing the current to drop to the quiescent level. The voltage supplied to the solid state memory is thereafter ramped down during a Prepare Standby period, after which the dynamic power management device 10 resumes standby operation.

Figure 3:
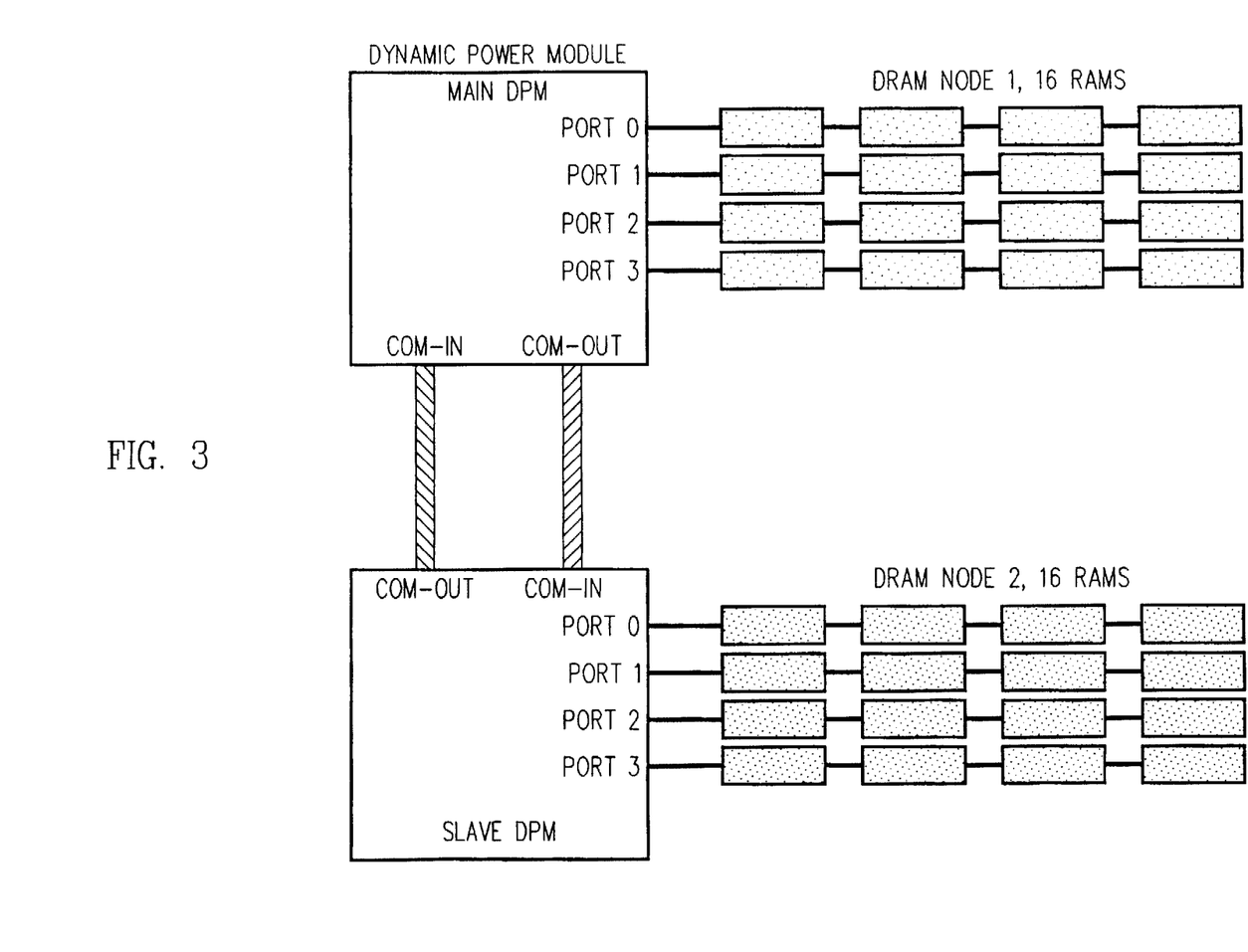
FIG. 3 is a block diagram illustrating how multiple dynamic power management devices may be daisy chained together.

Referring now to FIG. 3, expansion of the solid state memory from a single solid state memory device to any number of solid state memory devices may be achieved in two different ways. Using the daisy chain capability described in relation to FIG. 1, multiple dynamic power modules may be daisy chained together, each constituting a memory node. In addition, the dynamic power module may be modified to provide multiple ports, and a string of multiple memory devices may be connected to each port. In FIG. 3, four ports are provided and four memory devices are connected to each port such that a total of 16 memory devices are controlled by each dynamic power module. Connection of the memory devices to the dynamic power modules has been illustrated in simplified form. Each of the illustrated busses in practice includes data, address and control signals as well as an analog power bus.

Figure 4:
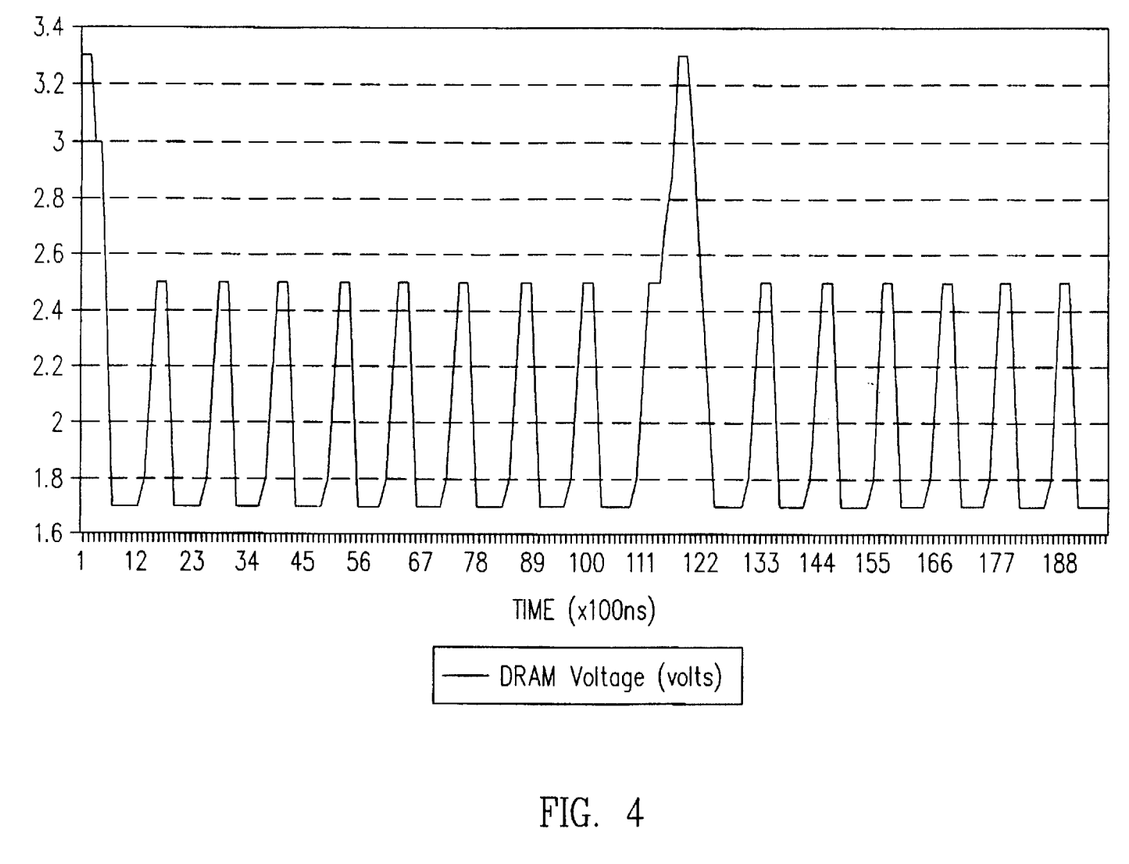
FIG. 4 is a waveform diagram of the voltage across string of four DRAMs during dynamic power management.

The voltage across one of the strings of four memory devices during operation of the dynamic power modules is shown in FIG. 4. During refresh, the voltage rises to about 3.3 volts. In between refresh intervals, the voltage pulsates between about 1.5 and 2.5 volts.

Figure 5:
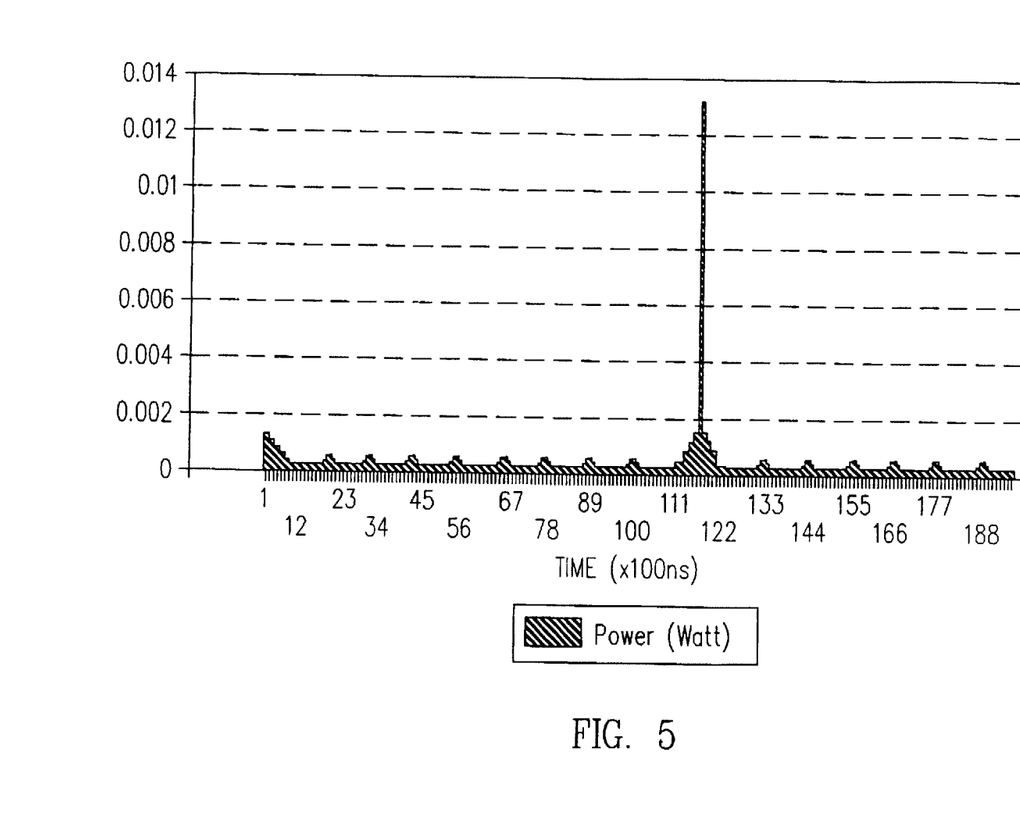
FIG. 5 is a graph of the power consumption of the four DRAMs.

The corresponding plot of power consumption is shown in FIG. 5. In between refresh intervals, power consumption remains well below 2 milliwatts. Slight power "bumps" occur at approximately 1 microsecond intervals, corresponding to the pulse width modulation rate. During refresh, power consumption spikes up sharply to about 13 milliwatts for a period of time on the order of 100 nanoseconds. Power consumption then subsides and resumes the previous pattern.

Figure 6:
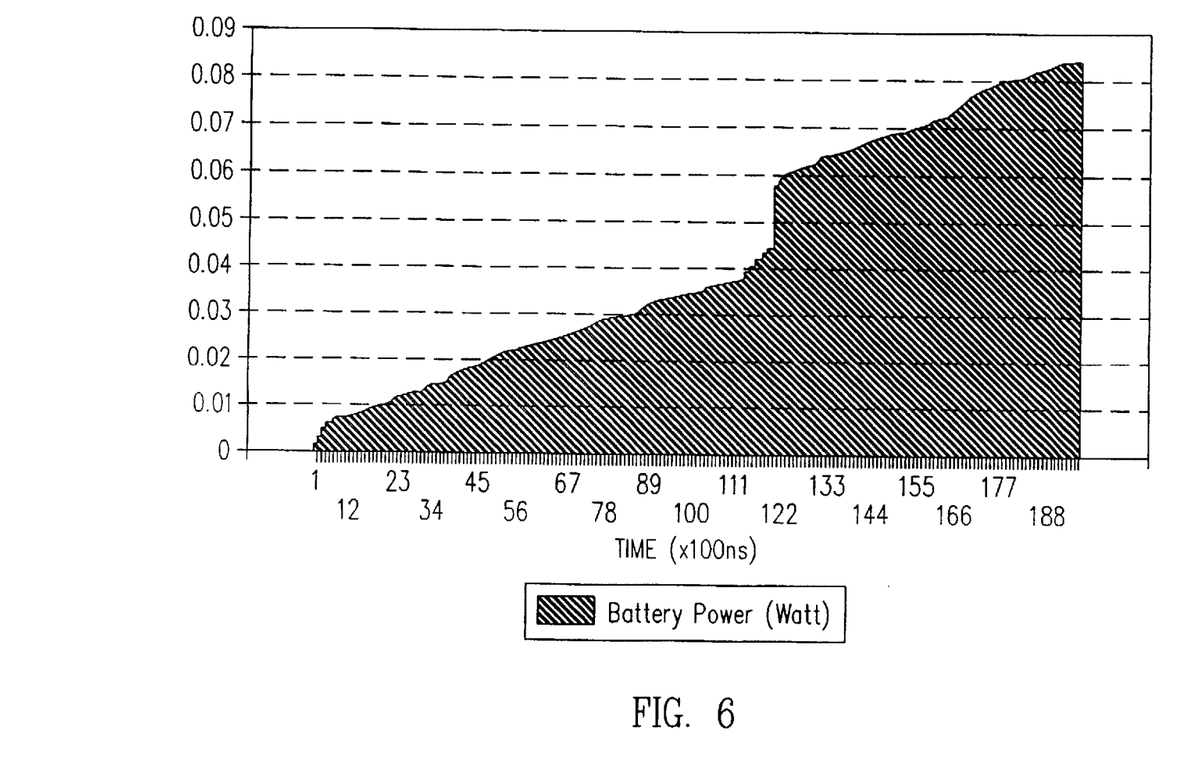
FIG. 6 is a graph showing the cumulative amount of battery power consumed by the four DRAMs.

A corresponding plot of total battery power consumed over time is shown in FIG. 6. The amount of power consumed increases at a rate of about 3 milliwatts per microsecond up until refresh, at which time a step increase in power consumption of about 20 milliwatts occurs, followed again by power consumption at the 3 milliwatt per microsecond rate.

Figure 7:
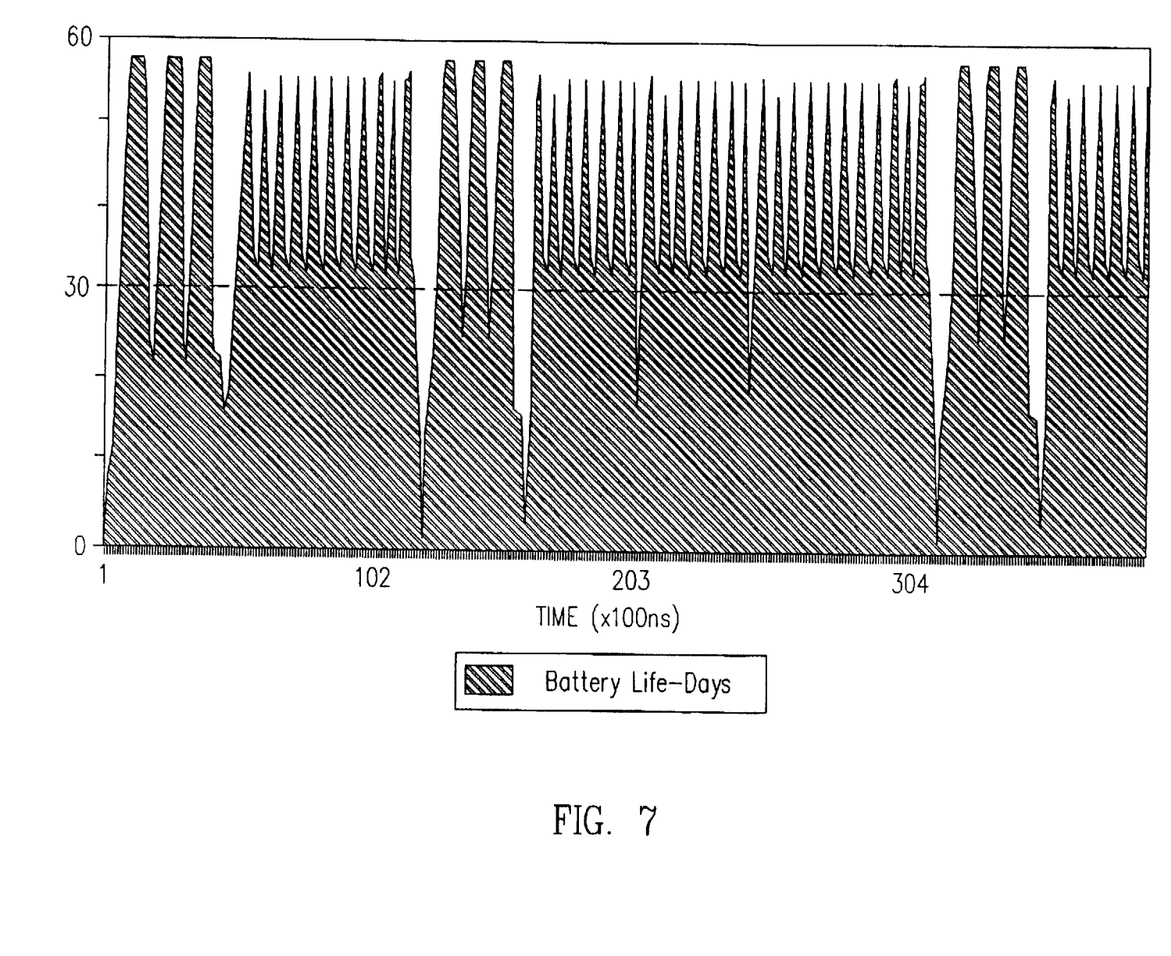
FIG. 7 is a graph of expected battery life over time as a function of power consumption.

FIG. 7 shows the expected life of a 15 milliamp-hour hot standby battery powering 8 DRAMs as a function of time as power is cycled to the DRAMs. During standby, expected battery life varies from a maximum of just less than 60 days to a minimum of slightly more than 20 days. During access, expected battery life drops precipitously to just several days. On the average, using dynamic power management, the battery may be expected to last more than 30 days, ample time under any normal circumstance. When coupled with the dynamic power management device of the present invention, DRAMs therefore provide a high-performance, high-reliability and cost-competitive alternative to small form factor hard disk assemblies.

The dynamic power management device, besides dynamically managing power consumption of the solid state memory, may also be designed to dynamically manage its own power consumption. Typically, the solid-state memory is accessed only about 10% of the time and operates in refresh and standby modes 90% of the time. The dynamic power management device may therefore sleep 90% of the time during refresh and standby modes. During refresh mode, only a simple counter is required to remain running to preserve refresh activity. The dynamic power management device wakes up upon access by the host. The dynamic power management device sleeps by: turning off all unnecessary logic; stopping all unnecessary clocking; reducing the clock frequency by a factor of 10; shutting off all unnecessary driver transistors to the outside world; waking up when accessed by an external interface request; and automatically readjusting clocks and active circuits. By managing its own power consumption in addition to the power consumption of memory, the dynamic power management device minimizes overall power consumption.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of the present invention as defined by the following claims.

What is claimed is:

1. A dynamic power management device for supplying power to a solid state memory integrated circuit, said device comprising:

power control means for supplying a variable voltage to said memory integrated circuit; and logic control means for generating address and control signals for said memory integrated circuit and for controlling said power control means;

wherein the power control means supply power to said memory integrated circuit, said power being supplied to the memory integrated circuit at a first variable voltage level during periods of no data access activity and at a second variable voltage level during periods of data access activity, the variable voltage supplied at said first variable voltage level being less than the variable voltage supplied at said second variable voltage level, wherein the power supplied at the first level is sufficient to preserve information stored in the integrated memory circuit and the power supplied at the second level is sufficient to read and write information in the integrated memory circuit.

2. The dynamic power management device of claim 1, further comprising I/O means for converting parallel data signals to serial data signals for input to said memory integrated circuit and for converting data signals output from said memory integrated circuit from serial to parallel.

3. The dynamic sower management device of claim 2, wherein said power control means comprises means for selecting between alternate power sources, and means for feeding voltage information back to said logic control means.

4. The dynamic power management device of claim 3, wherein said voltage information includes both voltage output information used by said logic control means to cause said power control means to maintain a specified voltage output and voltage source information used by said logic control means to cause said means for selecting to select one of said alternate power sources.

5. The dynamic power management device of claim 4, wherein said power control means comprises a pulse width modulator circuits said logic control means causing said pulse width modulator circuit to generate a pulse width modulated signal having pulses with pulse widths proportional to said specified voltage output.

6. The dynamic power management device of claim 5, wherein said power control means further comprises a low pass filter, said low pass filter filtering said pulse width modulated signal.

7. The dynamic power management device of claim 6, wherein said power control means further comprises a FET driver circuit coupled to said pulse width modulator circuit, said FET driver circuit generating a variable voltage having a voltage level proportional to the pulse widths of pulses in said filtered pulse width modulated signal.

8. The dynamic power management device of claim 4, wherein said logic control means controls said power control means to maintain said specified voltage output through closed loop monitoring of said voltage output information.

9. The dynamic power management device of claim 3, wherein said logic control means generates said control signals for data access activity when said power control means supplies a voltage high enough to perform the data access activity and does not generate said control signals for data access activity when said power supply means does not supply a voltage high enough to perform the data access activity.

10. The dynamic power management device of claim 2, wherein said logic control means comprises a DNA controller, a data sequencer, and a timing sequencer.

11. The dynamic power management device of claim 10, wherein said logic control means further comprises refresh timer means for timing refresh intervals, a binary address generator, and an encoder, said logic control means generating said address signals for said memory integrated circuit.

12. The dynamic power management device of claim 11, wherein said encoder is a Gray code encoder.

13. The dynamic power management device of claim 2, further comprising slew rate controller means for limiting the time rate of change of voltage of said control signals and said data signals transmitted to said memory integrated circuit.

14. The dynamic power management device of claim 2, wherein said periods of data access activity include memory access periods and memory refresh periods, wherein said periods of no data access activity include standby periods including periods between refresh periods and wherein said logic control means causes said power control means to supply to said integrated circuit a relatively low value of said voltage during said standby periods, a higher value of said voltage during said memory refresh periods, and a still higher value of said voltage during said memory access periods.

15. The dynamic power management device of claim 2, further comprising daisy chain controller means for enabling communication with another dynamic power management device.

16. The dynamic power management device of claim 2, wherein said logic control means is provided with a sleep mode for conserving power during periods of inactivity.

17. The dynamic power management device of claim 2, wherein said I/O means further comprises error correction means for detecting and correcting errors in said parallel data signals.

18. The dynamic power management device of claim 1, wherein said power control means further comprises an internal voltage generator, said internal voltage generator generating a calibration voltage.

19. The dynamic power management device of claim 1, wherein said dynamic power management device supplies power to a plurality of memory integrated circuits in said computer system.

20. The dynamic power management device of claim 19, wherein said dynamic power management device further comprises a plurality of ports, each port of said plurality of ports coupled to one memory integrated circuit of said plurality of memory integrated circuits.

21. An integrated circuit for controlling a level of power supplied to a solid state memory integrated circuit having a first operation period for maintaining information stored in said memory integrated circuit, a second operation period for refreshing data stored in said memory integrated circuit, and a third operation period for accessing said memory integrated circuit, said memory integrated circuit having a first voltage requirement during said first operational period, a second voltage requirement during said second operational period and a third voltage requirement during said third operational period, said integrated circuit comprising:

power control means for supplying a variable voltage to said memory integrated circuit; and logic control means for causing said power control means to supply to said memory integrated circuit a first voltage during said first operation period, a second voltage different from said first voltage during said second operation period, and a third voltage different from said first and second voltages during said third operation period.

22. The integrated circuit of claim 21, wherein said logic control means causes said memory integrated circuit to enter said first, second or third operation period only when said power control means supplies a voltage meeting the voltage requirements of said memory integrated circuit to enter said first, second or third operation period, respectively.

23. A dynamic power management device for supplying power to a solid state memory integrated circuit in a computer system having a power source supplying a substantially constant voltage, said dynamic power management device comprising:

power control means coupled to said power source for supplying a variable voltage to said memory integrated circuit, said variable voltage being less than or equal to said substantially constant voltage supplied by said power source; and logic control means for generating address and control signals for said memory integrated circuit and for controlling said power control means;

wherein the power control means supply power to said memory integrated circuit, said power being supplied to the memory integrated circuit at a first variable voltage level during periods of no data access activity and at a second variable voltage level during periods of data access activity, the variable voltage supplied at said first variable voltage level being less than the variable voltage supplied at said second variable voltage level, wherein the power supplied at the first level is sufficient to preserve information stored in the integrated memory circuit and the power supplied at the second level is sufficient to read and write information in the integrated memory circuit.

* * * * *

(12) EX PARTE REEXAMINATION CERTIFICATE (9752nd)
United States Patent
McKinley (10) Number: US 5,781,784 C1
(45) Certificate Issued: Jul. 17, 2013

(54) DYNAMIC POWER MANAGEMENT OF SOLID STATE MEMORIES

(75) Inventor: David E. McKinley, San Jose, CA (US)

(73) Assignee: Optimum Power Solutions LLC

Reexamination Request:
No. 90/012,358, Jun. 15, 2012

Reexamination Certificate for:
Patent No.: 5,781,784
Issued: Jul. 14, 1998
Appl. No.: 08/918,745
Filed: Aug. 25, 1997

Related U.S. Application Data (63) Continuation of application No. 08/368,577, filed on Jan. 4, 1995, now abandoned, which is a continuation of application No. 07/910,213, filed on Jul. 9, 1992, now abandoned.

(51) Int. Cl.
*G06F 1/32* (2006.01)

(52) U.S. Cl.
USPC ........... 713/320; 365/227; 365/228; 713/300; 713/321

(58) Field of Classification Search
None
See application file for complete search history.

(56) References Cited

To view the complete listing of prior art documents cited during the proceeding for Reexamination Control Number 90/012,358, please refer to the USPTO's public Patent Application Information Retrieval (PAIR) system under the Display References tab.

*Primary Examiner* — Angela M Lie (57) ABSTRACT

A dynamic power management device for supplying power to a solid state memory integrated circuit includes power control circuitry for supplying a variable voltage to the memory integrated circuit and logic control circuitry responsive to data access activity for generating address and control signals for the memory integrated circuit and for controlling the power control circuitry to supply power to the memory integrated circuit sufficient to maintain memory information in the memory integrated circuit during periods of no data access activity and sufficient to exchange memory information with the memory integrated circuit during periods of data access activity. Power consumption of the memory integrated circuit is thereby curtailed.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1-20 and 23 is confirmed.

Claims 21 and 22 are cancelled.

\* \* \* \* \*